(12) United States Patent
Parrish et al.

(10) Patent No.: US 12,055,446 B2
(45) Date of Patent: Aug. 6, 2024

(54) COST EFFECTIVE, MASS PRODUCIBLE TEMPERATURE CONTROLLED THERMAL IMAGING CALIBRATION SOURCE (71) Applicant: Seek Thermal, Inc., Goleta, CA (US)

(72) Inventors: William J. Parrish, Santa Barbara, CA (US); Andrew Duerner, Santa Barbara, CA (US); Brian Nehring, Santa Barbara, CA (US); Matt Buckley, Santa Barbara, CA (US); Charles Meyer, Santa Barbara, CA (US)

(73) Assignee: Seek Thermal, Inc., Goleta, CA (US)

( * ) Notice: Subject to any disclaimer, the term of this patent is extended or adjusted under 35 U.S.C. 154(b) by 815 days.

(21) Appl. No.: 17/202,084

(22) Filed: Mar. 15, 2021

(65) Prior Publication Data

US 2021/0293632 A1     Sep. 23, 2021

Related U.S. Application Data

(60) Provisional application No. 63/026,612, filed on May 18, 2020, provisional application No. 63/003,730, (Continued)

(51) Int. Cl.
*G01K 15/00*     (2006.01)
*H05K 1/02*     (2006.01)

(52) U.S. Cl.
CPC ......... *G01K 15/002* (2013.01); *G01K 15/005* (2013.01); *H05K 1/0212* (2013.01); *H05K 2201/10151* (2013.01)

(58) Field of Classification Search
CPC ............ G01K 11/3213; G01K 11/324; G01K 15/005; G01K 15/002; G01K 15/00; (Continued)

(56) References Cited

U.S. PATENT DOCUMENTS 4,387,301 A * 6/1983 Wirick ............ G01J 5/52
                                               374/2
5,377,126 A * 12/1994 Flik ............ G01J 5/0007
                                               427/10
(Continued)

FOREIGN PATENT DOCUMENTS

CN     204788735 U * 11/2015
CN     111721428 A * 9/2020 ............ G01J 5/522
(Continued)

OTHER PUBLICATIONS

Article "Using Circuit Board Materials for Thermal Control in Medical Diagnostics", Jun. 1, 2016.*
(Continued)

*Primary Examiner* — Gail Kaplan Verbitsky
(74) *Attorney, Agent, or Firm* — Knobbe, Martens, Olson & Bear LLP (57) ABSTRACT

A temperature controlled calibration source for thermal imaging that provides for extremely inexpensive, mass producible, field deployable thermal calibration in specific, relatively low temperature ranges, and in particular temperatures near nominal human body temperature. A calibration source suitable for such applications may be implemented primarily as a suitable designed Printed Circuit Board (PCB), packaged in a thermally isolating housing and powered of commonly available power sources such as USB chargers.

20 Claims, 9 Drawing Sheets

Related U.S. Application Data filed on Apr. 1, 2020, provisional application No. 62/990,977, filed on Mar. 17, 2020.

(58) Field of Classification Search
CPC .. G01K 1/028; G01J 5/80; G01J 5/041; G01J 5/025; G01J 5/046; G01J 5/802; G01J 5/532; G01J 5/53; G01J 5/0205; G01J 2005/0077; G01J 5/0025; H05K 1/0212; H05K 2201/10151
See application file for complete search history.

(56) References Cited

U.S. PATENT DOCUMENTS

| | | | |
|---|---|---|---|
| 6,300,632 B1 * | 10/2001 | Liu | G01J 5/06 |
| | | | 250/336.1 |
| 6,365,877 B1 * | 4/2002 | Chen | G01J 5/53 |
| | | | 219/400 |
| 10,386,241 B1 * | 8/2019 | Staple | G01J 5/10 |
| 2009/0122826 A1 * | 5/2009 | Liebmann | G01J 5/532 |
| | | | 374/2 |

FOREIGN PATENT DOCUMENTS

| | | | | |
|---|---|---|---|---|
| CN | 113218514 A | * | 8/2021 | |
| CN | 116793505 A | * | 9/2023 | |
| EP | 0063415 B1 | * | 3/1986 | |
| FR | 2923603 A1 | * | 5/2009 | ............. G01J 5/524 |
| JP | 57131027 A | * | 8/1982 | |
| JP | 2000515638 A | * | 11/2000 | |
| KR | 20230040118 A | * | 3/2023 | |

OTHER PUBLICATIONS

17202084_Mar. 25, 2024_CN_204788735_U_H.pdf,Nov. 18, 2015.*
17202084_Mar. 25, 2024_JP_2000515638_A_H.pdf,Nov. 21, 2000.*
17202084_Mar. 26, 2024_CN_111721428_A_H.pdf,Sep. 29, 2020.*
17202084_Mar. 26, 2024_CN_113218514_A_H.pdf,Aug. 6, 2021.*
17202084_Mar. 26, 2024_CN_116793505_A_H.pdf,Aug. 6, 2021.*
17202084_Mar. 27, 2024_FR_2923603_A1_H.pdf,May 15, 2009.*
17202084_Mar. 26, 2024_KR_20230040118_A_H.pdf,Mar. 22, 2023.*
17202084_Mar. 26, 2024_JP_57131027_A_H.pdf,Aug. 13, 1982.*
17202084_Mar. 27, 2024_EP_0063415_B1_H.pdf,Mar. 5, 1986.*

* cited by examiner

COST EFFECTIVE, MASS PRODUCIBLE TEMPERATURE CONTROLLED THERMAL IMAGING CALIBRATION SOURCE

INCORPORATION BY REFERENCE

This application claims the benefit of U.S. Provisional Application Ser. No. 62/990,977, filed Mar. 17, 2020; U.S. Provisional Application Ser. No. 63/003,730, filed Apr. 1, 2020; and U.S. Provisional Application Ser. No. 63/026,612, filed May 18, 2020, each of which is incorporated herein by reference in its entirety. The following applications are also incorporated herein by reference in their entirety: U.S. application Ser. No. 16/809,387, filed Mar. 4, 2020, now U.S. Pat. No. 10,890,490; U.S. Provisional Application Ser. No. 62/990,971, filed Mar. 17, 2020; U.S. Provisional Application Ser. No. 63/003,754, filed Apr. 1, 2020; U.S. Provisional Application Ser. No. 63/011,692, filed Apr. 17, 2020; and U.S. Provisional Application Ser. No. 63/137,994, filed Jun. 29, 2020.

FIELD

The present disclosure generally relates to imaging systems including thermal imaging sensors, and in particular to a field deployable, inexpensive temperature calibration source.

BACKGROUND

The increasing availability of high-performance, low-cost uncooled thermal imaging devices, such as those based on bolometer focal plane arrays (FPAs), is enabling the design and production of mass produced thermal imaging cameras. Widespread medical screening processes involving quick and accurate determination of body temperature may be implemented using thermal imaging. Unlike most conventional thermal imaging processes, some medical applications such as body temperature determination may need to be accurate over narrow and/or specific temperature ranges. It is possible to produce large numbers of inexpensive thermal imagers with performance suitable for such applications. However, existing mass producible thermal imaging devices alone may not be able to reliably determine temperatures within the relatively narrow range of human body temperatures separating a normal temperature from a fever, for example.

SUMMARY

The systems of this disclosure each have several innovative aspects, no single one of which is solely responsible for its desirable attributes. Without limiting the scope as expressed by the claims that follow, its more prominent features will now be discussed briefly.

A temperature controlled calibration source for thermal imaging may be provided that provides for extremely inexpensive, mass producible, field deployable thermal calibration in specific, relatively low temperature ranges, and in particular temperatures near nominal human body temperature. A calibration source suitable for such applications may be implemented primarily as a suitably designed Printed Circuit Board (PCB), packaged in a thermally isolating housing and powered from commonly available power sources such as USB chargers or AC-DC power supplies.

A temperature controlled calibration source may be provided including a housing; a power supply element; a printed circuit board (PCB) comprising at least one copper layer, wherein a resistive heater spanning a heated region is disposed on a first side of the PCB, and wherein a heat conductive layer spanning at least a portion of the heated region is disposed on a copper layer of the PCB opposite the heater; a calibrated temperature sensor disposed to measure a temperature of the heat conductive layer; and a controller circuit configured to read the calibrated temperature sensor and to power the heater in feedback to the temperature sensor to maintain a predetermined temperature of the heat conductive layer. The heat conductive layer functions as an even temperature blackbody calibration source for thermal camera calibration.

In some embodiments, the controller circuit may include at least one of analog circuits or a programmable microcontroller.

In some embodiments, the heat conductive layer may be a metal layer, including at least a portion of the PCB deposited copper.

In some embodiments, the controller circuit and the power supply element may be disposed on the first side of the PCB, and the temperature sensor is thermally connected to the heat conductive layer.

In some embodiments, the heat conductive layer may be at least one of painted or coated with a layer of a color having a predetermined emissivity.

In some embodiments, the layer of the color may be chosen to have an emissivity matching human skin, including an emissivity of 0.98+/−0.01 and 0.95+/−0.05.

In some embodiments, the heat conductive layer may be at least one of painted or coated with a layer of a color that provides a recognizable color for pattern recognition detection of the calibration source.

In some embodiments, the resistive heater may be a serpentine pattern and the heated region is a suitable shape, including one of square, circular or rectangular. In some embodiments, the rectangular or square heated region may have a minimum lateral dimension greater than at least one of 2, 3, or 4 inches.

In some embodiments, the power supply element may include a USB connection, a battery, an ac-dc converter, an ac-dc battery charger, a traditional ac power supply, or a solar cell power supply.

In some embodiments, the temperature controlled calibration source may further include a thermal insulation layer encasing at least a portion of the PCB and other components.

In some embodiments, the housing may include a bezel that masks off one or more edges of the heat conductive layer, thereby masking off a part of the heat conductive layer where a temperature gradient is greatest.

In some embodiments, the predetermined temperature may be within a range corresponding to within at least one of 15, 10, or 5 degrees of nominal human body temperature.

In some embodiments, the predetermined temperature may be nominally one of 42.5 or 41 degrees C., selected to be likely the highest temperature in a scene. In some embodiments, the calibration source comprises a portion of a system including a thermal imager, the calibration source operable in conjunction with the thermal imager to calibrate the system for detection of body temperature corresponding to fever conditions.

In some embodiments, the PCB may include at least four copper layers including a bottommost layer covering at least a portion of a substrate of the PCB and serving as a heat spreader; a second layer adjacent to the bottommost layer, the second layer covering at least a portion of the PCB substrate and serving as a heat spreader; a third layer adjacent to the second layer opposite the bottommost layer, the third layer having a heater etched therein; and a top layer adjacent to the third layer opposite the second layer, the top layer including the controller circuit, the heated region, and the temperature sensor, connected directly to the heated region.

In some embodiments, the heated region may include an etched gap disposed inside at least one edge of the region to improve temperature uniformity across the region. In some embodiments, the gap may be at least 1 mm wide.

In some embodiments, the calibration source may include an additional heat spreading element in the form of metal sheet bonded in a thermally conductive manner to the temperature controlled surface.

In some embodiments, the calibration source may further comprise a data connection, and the controller may be further configured to allow for data communication and control functions over the data connection.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. Throughout the drawings, similar symbols typically identify similar components, unless context dictates otherwise.

DETAILED DESCRIPTION

The following description is directed to certain implementations for the purpose of describing the innovative aspects of this disclosure. However, a person having ordinary skill in the art will readily recognize that the teachings herein can be applied in a multitude of different ways.

Generally described, embodiments of the present disclosure relate to applying thermal imaging to applications where the performance requirements are within specific relatively narrow temperature ranges compared to general purpose thermal imaging. For such applications it may be possible to provide thermal imaging components that are very inexpensive and can be produced and deployed in large quantities, while still maintaining adequate performance for the particular application. Such high volume medical thermal imaging applications may benefit from limited-performance, mass producible temperature calibration sources.

One application suitable for thermal imaging of great current interest is the rapid detection of fever conditions in human beings, particularly with regards to workplaces, travel, entertainment and sports venues, restaurants, hospitality providers, and other situations where it is desirable to prevent people that are sick from close interaction with numbers of others, for example, any group setting in which multiple people from different households or locations may gather in close proximity and/or within an enclosed space. This application is rapidly growing with the advent of new epidemic and pandemic type illnesses whose spread is critical to control by avoiding person-to-person transmission in group settings.

Fever detection applications in accordance with the present technology may be based on the measurement of a skin temperature at the surface of the body, which is related to internal body temperature. In some aspects, fever detection may be especially suitable for thermal imaging, as compared to many other thermal imaging applications that must perform over a wide range of scene temperatures. The temperature range of interest is relatively small, basically within a few degrees of a nominal body temperature (e.g., within a span of approximately 10 degrees C. or less). Because human body temperature is typically higher than most ambient temperatures, these relevant temperatures may appear as high-contrast ranges compared to most ambient temperatures in the locations where such systems are implemented. Additionally, the spatial resolution requirements of such imaging systems may be satisfied, for example, as long as portions of a face can be resolved within the field of view (FOV) of a thermal camera, usually achievable assuming the imaging is done as people pass through doorways, check points or other controlled access arrangements where the distance from the imager to the target can be suitably controlled.

Thus, accurate temperature measurements within specifically defined narrow temperature ranges may be suitable. Thermal cameras suitable for such applications may allow for significantly less stringent specifications and manufacturing tolerances than high performance general purpose thermal cameras.

One aspect that remains challenging, however, is that even for the defined temperature range of interest (e.g., a range of 10 degrees C. or less), the accuracy of thermography (e.g., determination of surface or scene temperature based on the signal output of an imager such as a focal plane array) over that relatively small range needs to be very accurate. For example, in various implementations, desired resolution within the temperature range of interest may be 2 degrees C., 1 degree C., 0.5 degrees C. 0.25 degrees C., or better. Achieving such accuracy over time and varying ambient temperature is difficult for low cost thermal imaging devices and systems.

A novel approach, as disclosed in accordance with the present technology, is to accept that the thermal imagers, in order to be accessible from a cost and availability standpoint, may not be able to provide the desired performance alone. A solution may be to perform a real-time thermography calibration in the field at or within the temperature range of interest, using cost-effective components suitable for this particular task. As will be discussed in greater detail herein, even a lower-performance thermal imaging device may be adapted to perform very precisely within a desired range (e.g., within a few degrees, up to 10 degrees C. or more) of a calibration temperature, by calibrating the thermal imaging device repeatedly (e.g., periodically, occasionally, or continuously) at a given calibration temperature.

This field calibration approach is promising. However, to practically implement this approach, a field installable, temperature-controlled calibration source (e.g., a fixed-temperature blackbody or the like) may be desirable. Mass production and widespread deployment of such systems may be improved by the use of calibration sources that can be manufactured with the same cost and manufacturing advantages as the low-cost thermal imagers implemented therewith.

The present technology provides cost effective, mass producible calibration sources that address the challenges discussed above. Preferably, the calibration source may present a uniform-temperature or substantially uniform-temperature portion of a scene to the thermal imager, simultaneously or near in time, with imaging of the target (e.g., for body temperature detection applications, the target may be a human being in a controlled space such as a predefined measurement area, a doorway, or checkpoint, or other controlled access region). In some embodiments, a region having a known size and shape (e.g., a rectangle, square, round, or other shape) is kept at a uniform or substantially uniform known temperature, in a package that is easy to mount and power in the type of locations described above. For body temperature detection applications, in order to provide a real-time thermography check, the uniform temperature region may be, for example, within 1 to 15 degrees for example of a nominal human body temperature (or other animal body temperatures as well for animal applications). Thus, a flat rectangular (or other shaped) region, usually of a dimension selected based at least in part on the FOV of the imagers and/or other design criteria, may be held at a fixed temperature. In many circumstances, the fixed temperature may be relatively close to an ambient temperature, typically less than 20 degrees C. difference. This modest temperature differential, much less than the hundreds of degrees required for general purpose blackbodies, allows for a novel and effective approach to thermal calibration source design.

Figure 1A:
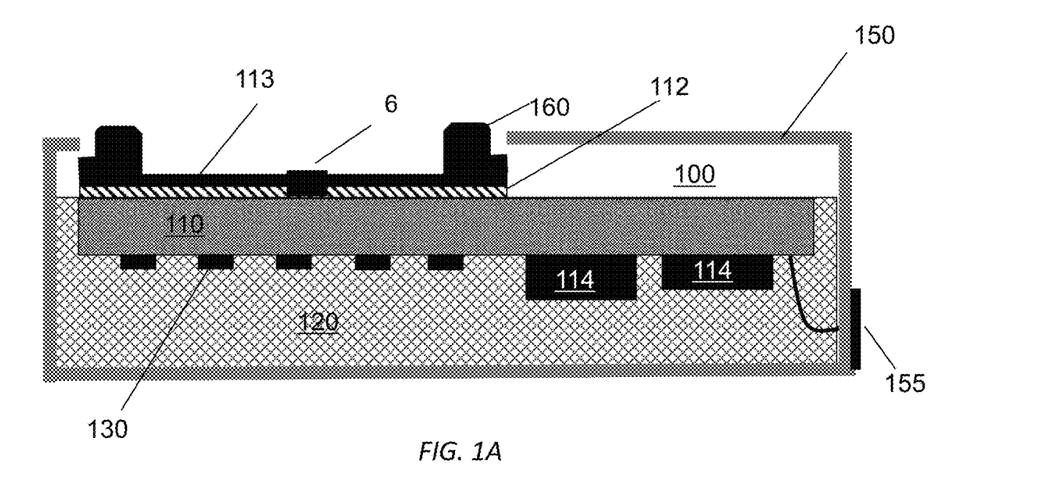
FIGS. 1A and 1B show various exemplary aspects of an illustrative calibration source.
Figure 1B:
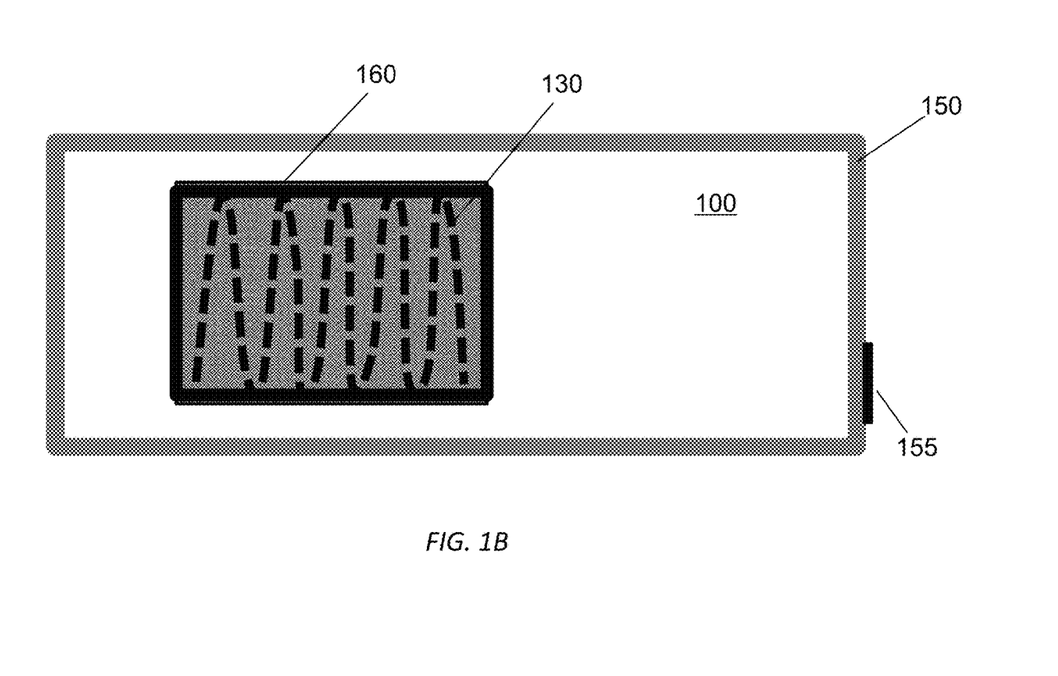

Referring to FIGS. 1A and 1B, an example calibration source 100 in accordance with the present technology is shown. In some embodiments, as shown in FIG. 1A, the main functional elements of the calibration source 100 may advantageously be implemented on a printed circuit board (PCB) 110. The calibration source 100 is illustrated in FIG. 1A as a two-layer PCB; however, multi-layer boards having more than two layers may alternatively be utilized, possibly with different or better thermal performance. However, for purposes of illustration, the two-layer PCB will be discussed. On the upper side of PCB 110 is a thermally conductive layer 112. The thermally conductive layer 112 may be a highly thermally conductive layer, such as a metal layer, to achieve thermal uniformity or substantial uniformity across the conductive layer 112. In some embodiments, thermally conductive layer 112 includes all or part of the native deposited copper layers present in most PCBs. Thermally conductive layer 112 forms a temperature-controlled flat source region that is optically presented to a thermal imager. On the opposite side of the PCB 110 from the thermally conductive layer 112 is a resistive heater 130. Resistive heater 130 covers all or part of the region of the opposite side of the PCB 110 that is opposite the region occupied by thermally conductive layer 112. Conventionally, a heater such as resistive heater 130 working through the relatively low heat conductivity of the body of the PCB 110 would not be practical for many blackbody applications. However, due to the relatively small temperature difference (delta) relative to ambient temperature that may be needed for the present implementations, this arrangement is unexpectedly suitable. For purposes of illustration, resistive heater 130 is shown as a serpentine shape, although a variety of other shapes and/or conductive paths may equally be implemented.

Also disposed on PCB 110 are circuit elements 114. Circuit elements 114 are shown in FIG. 1A as being disposed on the heater side of the PCB 110, but may additionally or alternatively be disposed on the same side of the PCB 110 as the conductive layer 112. Also shown is a calibrated temperature sensor 6 that can be thermally connected to the radiative surface (e.g., the thermally conductive layer 112). Due to the thermal connection to the thermally conductive layer 112, a temperature reading of the calibrated temperature sensor 6 is directly proportional to the temperature of thermally conductive layer 112. The sensor may be coupled to the thermally conductive layer 112 by any suitable method that maintains the thermal connection, such as being soldered directly to the top metal layer of the PCB 110. In some embodiments, heater driver circuitry and/or feedback control (which may be in the form of a PID loop executing on an inexpensive microcontroller) may be included as well. Power and external interface circuitry may further be included as power and interface connector 155.

In some embodiments, operational efficiency may be improved by thermally isolating the back surface of PCB 110 (e.g., the surface of PCB 110 including the resistive heater 130) from the ambient environment. Thus, an optional insulating layer 120, such as a thermal foam or other insulating material, is shown isolating PCB 110 from housing 150. In some embodiments, thermal isolation and/or operational efficiency may further be improved by wiring an external connector 155 to PCB 110, rather than using a conventional chassis-mount PCB connector, despite the simpler manufacturing processes associated with chassis-mount PCB connectors. Alternatively, a PCB mount connector may be thermally isolated from the chassis if desired, although for some chassis materials such as plastic, thermal isolation may be naturally present.

One or more optional layers 113, such as a layer of paint or other coating, may be present as well. Such color layers may be employed to control emissivity, for example. It may be beneficial, to improve the efficacy of the calibration, to configure the top level to be at an emissivity at or near that of human skin. This emissivity is generally considered to be approximately 0.95 or 0.98 and may be achievable with suitable paints or other coatings. In some embodiments, an optional layer 113 may comprise a high-contrast color in the visible spectrum (e.g. red or other suitable color likely to stand out visually from the surroundings within the FOV). Advantageously, a high-contrast color optional layer 113 may make it easier for pattern recognition imaging (e.g. visible wavelength imaging) to locate the thermally controlled region.

As shown in both FIGS. 1A and 1B, the temperature-controlled region of the thermally conductive layer 112 may be exposed through an aperture open to the environment in housing 150. As the temperature uniformity of the region may tend to decrease at or near the edges, optionally a suitably thermal designed bezel 160 may be employed to even out or hide variations in the uniformity across the observable portion of the region For a reasonable range of ambient temperature and suitable heater circuit characteristics, it is estimated that in many embodiments 3 watts on the average will be sufficient to bring thermally conductive layer 112 to, and maintain thermally conducive layer 112 at or nearly above, human body temperature, depending on factors such as size and environmental conditions, ambient temperature, humidity, and/or air flow. This is easily accomplished within the power available from USB formats. Thus, in some embodiments a USB interface may be used which is easily found universally, or can be accessed simply available by plugging an appropriate USB charger into available wall power. Thus, for USB-powered embodiments, installation in substantially any setting would be straightforward. Of course, other power sources may be employed. Another example of a power source that is particularly convenient and pluggable almost anywhere would be an AC-DC converter of the type used to power laptops and other electronic devices.

The top surface of the thermally conductive layer 112 may be placed within a well formed by the aperture in the housing 150, which may aid in temperature uniformity by at least partially blocking air currents from flowing across the temperature-controlled surface.

Thus, an accurate temperature-controlled calibration source in the body temperature range can be achieved, essentially from one PCB element leading to a very inexpensive mass producible unit that is completely suitable for this particular temperature range.

Figure 2:
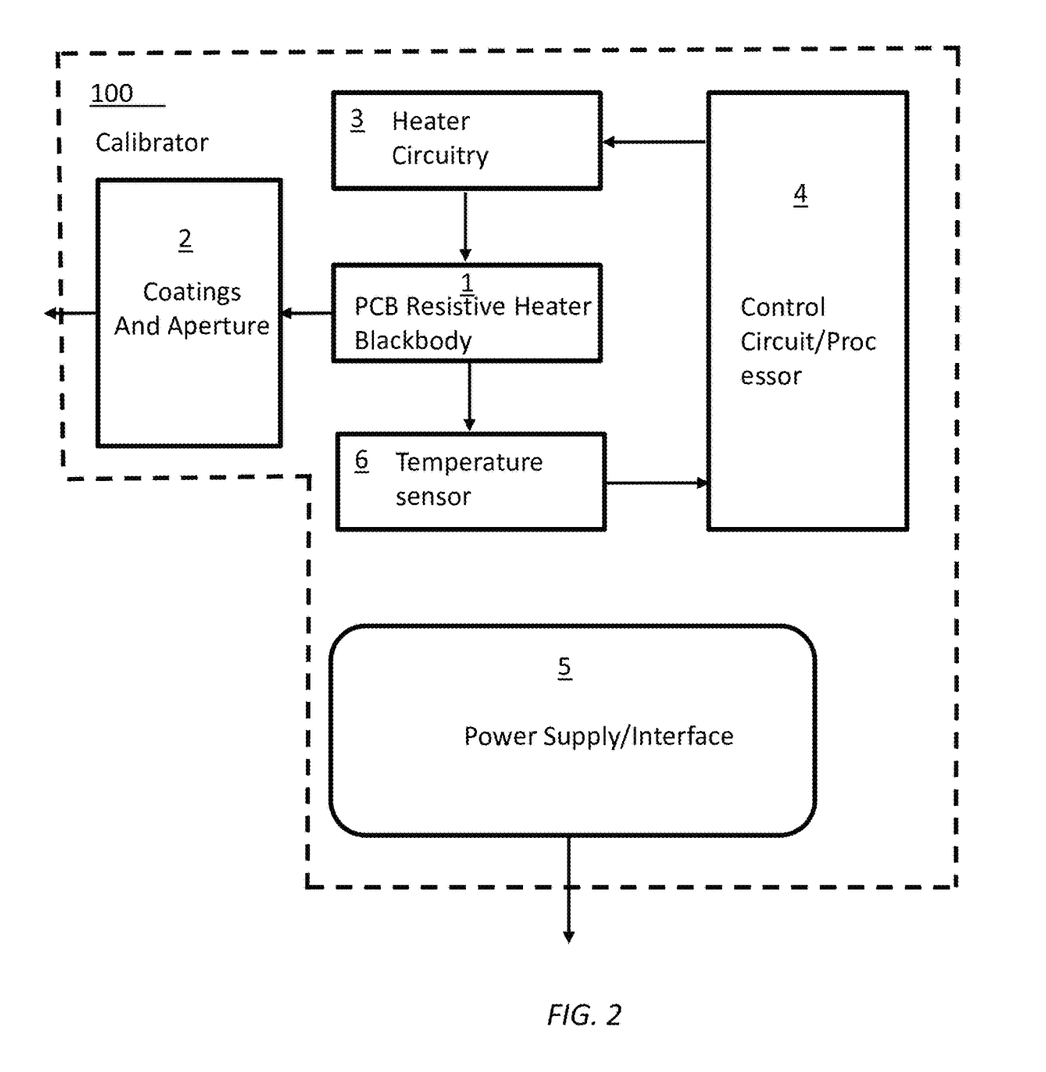
FIG. 2 is an exemplary block diagram of an illustrative calibration source.

FIG. 2 shows example elements of the calibration source 100 elements in schematic form. In some embodiments, control circuit 4, which may be a programmable controller, reads temperature sensor 6 and through heater circuitry maintains resistive heater 1 at the desired temperature, which the PCB implementation can easily achieve for body temperature applications. Coatings and apertures 2 further define the observable blackbody characteristics and size. Power and other interfaces 5 may be a USB interface for the body temperature PCB implemented calibrated source. A precision calibrated analog circuit as the temperature controller can be implemented as well. The temperature sensor may be analog or digital.

Other variations are possible. USB is a particularly convenient solution for power, but other alternatives, such as battery, ac-dc converter/battery charger, or a traditional ac power supply would be suitable as well as other power sources. For some installations direct solar cell power might be usable. Various user interface options are possible including indicators of one or more operational states such as a state of the heated region (e.g., heating up, at desired temperature, etc.) or if there is a problem with the unit. For example, an LED indicator could be used. In one specific example, the LED indicator may flash slowly to indicate that temperature hasn't been reached, may flash quickly to indicate a problem, and may be solid on to indicate that the unit is at temperature and functioning properly.

Figure 3A:
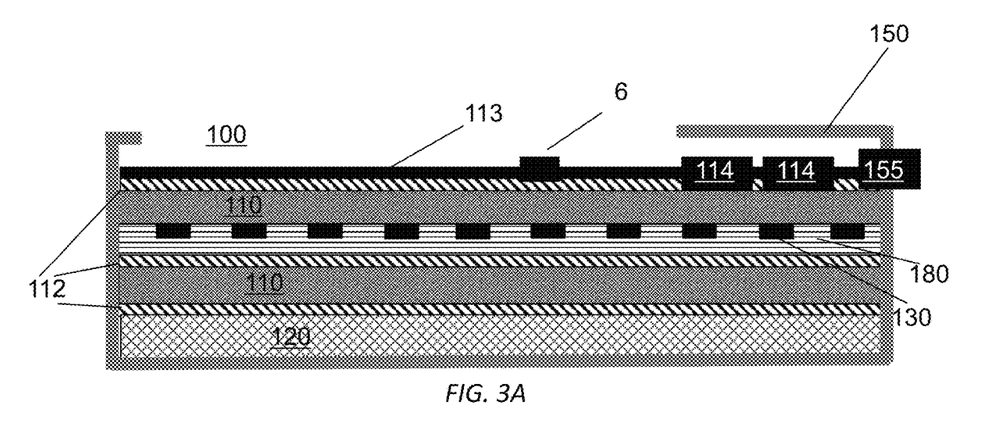
FIGS. 3A and 3B illustrate an exemplary embodiment of a suitable calibration source.
Figure 3B:
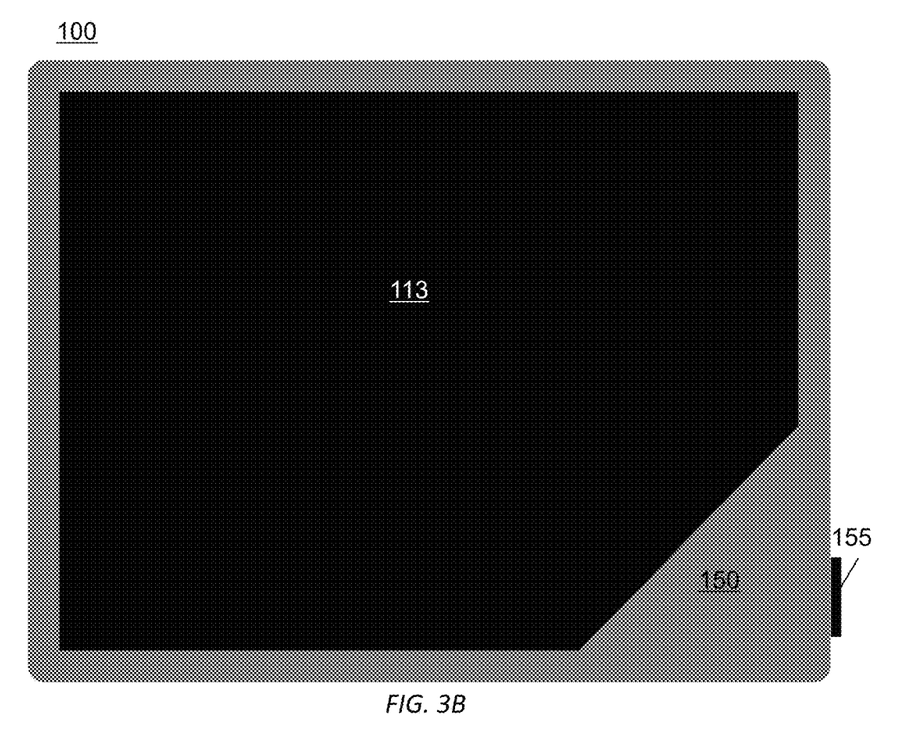

Turning to FIGS. 3A and 3B, an exemplary embodiment of a suitable calibration source will be described in detail, and certain features that aid in achieving desired performance will be described. The particular combination of features illustrated in FIGS. 3A and 3B is a non-limiting example and some or all of the features of the embodiment of FIGS. 3A and 3B may be incorporated in conjunction with any of the embodiments of the present technology disclosed herein. In the embodiment of FIG. 3A, a design including three copper layers 112 is shown. Two fiberglass substrates 110 bonded together with a bonding agent 180 are shown. It is also possible to add another copper layer and/or another PCB substrate in between the middle copper layers. The two bottommost copper layers 112 cover all or most of the substrate 110 surfaces and serve as heat spreaders to improve temperature uniformity. If desired or if more heating is required, additional resistive heaters may be provided on one or more of the additional copper layers 112. These additional resistive heaters may have their own independent control loops or circuitry including sensor, driver, and/or feedback loop, or resources such as control circuitry can be shared among a plurality of resistive heaters, as desired. Different variations of this arrangement may be suitable, but however the detailed arrangement, the concept of using native copper layers covering large areas of PCB substrates as heat spreaders has been found useful.

The heater 130 (e.g., a serpentine pattern) may be etched into the bottom copper layer 112 of the top PCB substrate 110, and desirably may be configured to cover all or most all of that layer's surface in a pattern (e.g., a serpentine or other pattern) configured for uniform or substantially uniform heating across all or most of the layer 110. The circuitry 114 in this embodiment occupies a segment of the top copper layer 112, but it could additionally or alternatively disposed on another layer, such as the opposite layer as in the embodiment of FIG. 1, or any other layer as desired. The top copper layer 112, optionally coated with suitable coating 113, serves as the source temperature calibration region. In this embodiment, the segment of the top layer 112 with the circuitry may be covered by a segment of the housing 150, as shown in FIG. 3B. For example, in some embodiments, the circuitry 114 may be disposed under a triangular region at the lower right corner of the housing 150, and the rest of the top heated surface 113 may be exposed. Other arrangements are possible.

In some embodiments, the sides and/or top portions of the housing 150 may comprise a plastic material having relatively low thermal conductivity, and thus it may not be necessary to thermally isolate the PCB components from the housing 150. Thus, in the example of FIGS. 3A and 3B, connector 155 is shown as a board mount connector passing through the housing 150. If any part of the housing (e.g., the bottom) comprises a metal or other thermally conductive material, an insulating layer 120 such as a foam may be disposed between the PCB elements and the thermally conductive portion of the housing. Additionally or alternatively, the insulating layer 120 may be present, even in embodiments in which the housing 150 does not include a metal or other highly thermally conductive material, to generally improve heating of the PCB, such as by making the heating process less lossy in general. Thermal sensor 6 is desirably placed in direct thermal contact with the top copper layer 112 as shown, so the temperature used in feedback is as correct as possible.

Figure 4A:
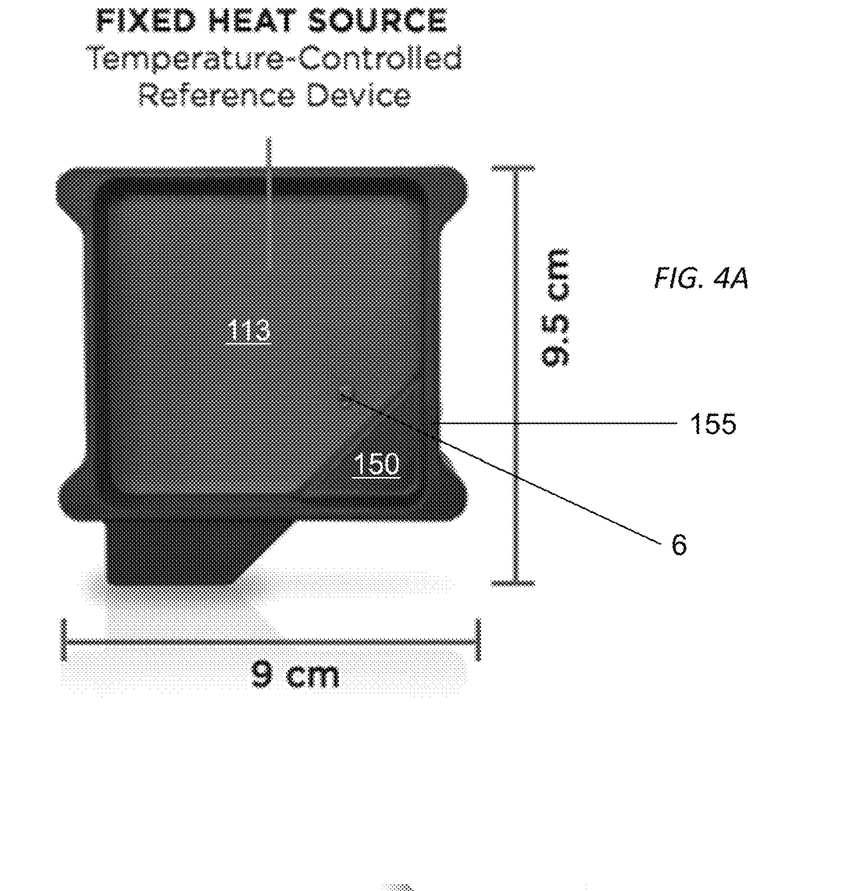
FIGS. 4A and 4B illustrate an exemplary implementation of the design of FIGS. 3A and 3B.
Figure 4B:
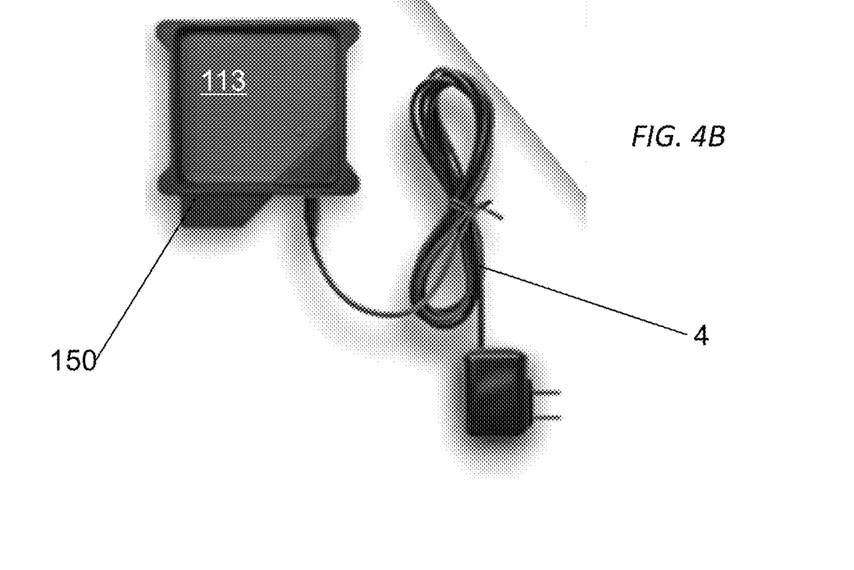

FIGS. 4A and 4B show external details of an example implementation of the design of FIGS. 3A and 3B. FIG. 4A shows example non-limiting dimensions of an exemplary unit, with a segment of the housing 150 in the bottom right corner covering the circuitry portion of the PCB, with the rest of the coated surface 113 exposed and viewable. Board mount power connector 155 extends out of one side of housing 150. As shown, temperature sensor 6 is placed directly on the top surface. It may be desirable to place sensor 6 off center to improve the reading accuracy. In this embodiment, sensor 6 is placed in approximately ⅓-⅔ arrangement relative to the side dimensions of the surface 113 (e.g., disposed at approximately one-third of the distance across the coated surface 113 in the lengthwise and/or widthwise dimensions).

The convenient nature of a plug-in type power supply 4, such as USB or an AC-DC converter type as illustrated, is shown clearly in FIG. 4B. An arrangement shown, where housing 150 has a standard mounting arrangement, such as a tripod screw mount type, could be conveniently hard mounted, or temporarily mounted to standard mounting devices, such as tripods, and plugged in almost anywhere.

Figure 5A:
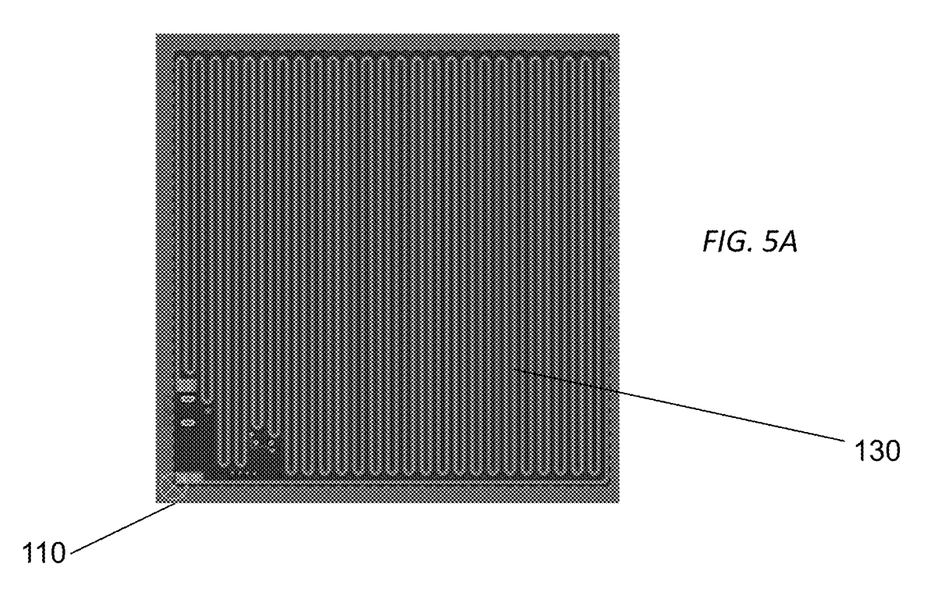
FIGS. 5A and 5B show further details of the exemplary embodiment of FIGS. 4A and 4B.
Figure 5B:
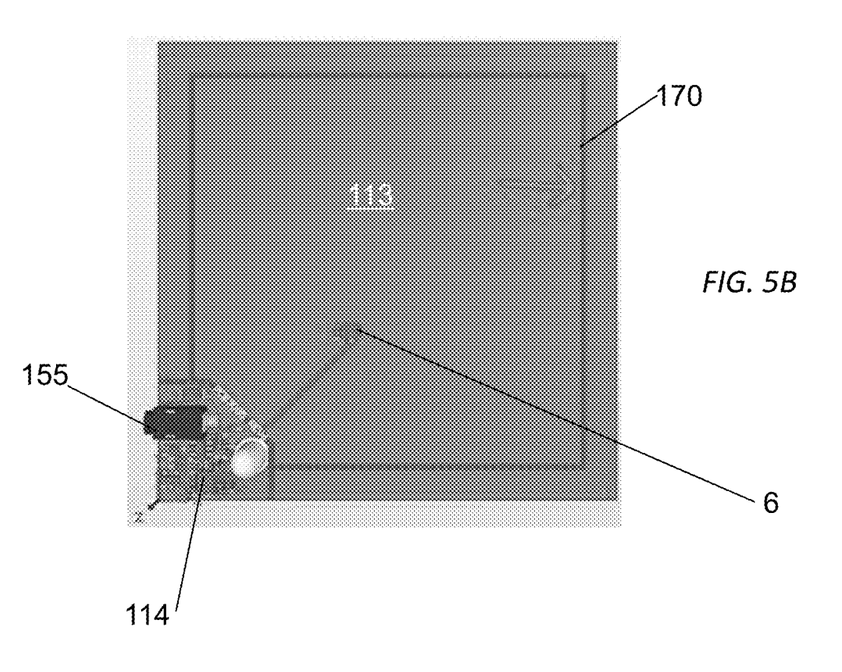

FIGS. 5A and 5B show internal details of the exemplary embodiment of FIGS. 4A and 4B, particularly of the top two copper layers. FIG. 5A shows a serpentine heater pattern 130 etched into a copper layer of PCB substrate 110, with an area in the lower left corner reserved for the interconnects, vias and the like, to connect the heater to the circuitry on layer on the opposite side of the PCB substrate 110. For a unit of the dimensions shown in FIG. 4A, and a serpentine pattern of a similar aspect ratio as shown in FIG. 5A, in standard PCB copper, a sustained temperature of 45 degrees C. or more may be maintained at a power draw well within that available across a USB standard interface. For a particular non-limiting system embodiment, a source temperatures of 41 or 42.5 degrees C. is used, clearly well within the design parameters of the exemplary embodiments.

FIG. 5B shows the side copper layer of the upper substrate, including circuitry 114 and USB connector 144 disposed in one corner of the top surface, that corner being covered by the housing 150 of FIG. 4A. Temperature sensor 6, possibly of a type where a copper surface of the sensor is soldered directly to the heated copper layer, is shown. Another feature that may improve performance is a gap 170 in the copper etched around the outer rim (and the traces to the temperature sensor 6). This gap 170 provides a filtering effect on the inevitable temperature fall off that occurs around the outside edge of most heating element, helping the area within the gap 170 to maintain a more uniform temperature. In the exemplary embodiment illustrated in FIG. 5B, the gap 170 is 1 mm wide, although other larger or smaller widths may be implemented. In some embodiments, the housing of the calibration source may be configured (e.g., may have an overhanging portion) to just expose the portion of the top surface 113 within the area bounded by the gap 170.

More than one temperature region could also be implemented, such as on two separate PCBs or suitably isolated on one. Control circuits could be separate, or if a suitable processor is utilized, parts of the control loop could be shared among different heaters.

In some embodiments, two viewable temperature sources within a single scene may be useful. Two sources could make it unnecessary to use thermography performed at manufacturing of the imager. A two-temperature source can be used as a real time thermography (temperature calibration) of the imager, thus ensuring that the thermography function is always accurate for the current conditions. For one exemplary embodiment, the two source temperatures can be chosen to bracket the temperature range of interest. In one particular example, the two temperatures may be set at 35 and 41 degrees C., respectively. Temperatures this close to each other can be easily maintained with two separate heaters and thermal layers on one PCB, for example.

Figure 6A:
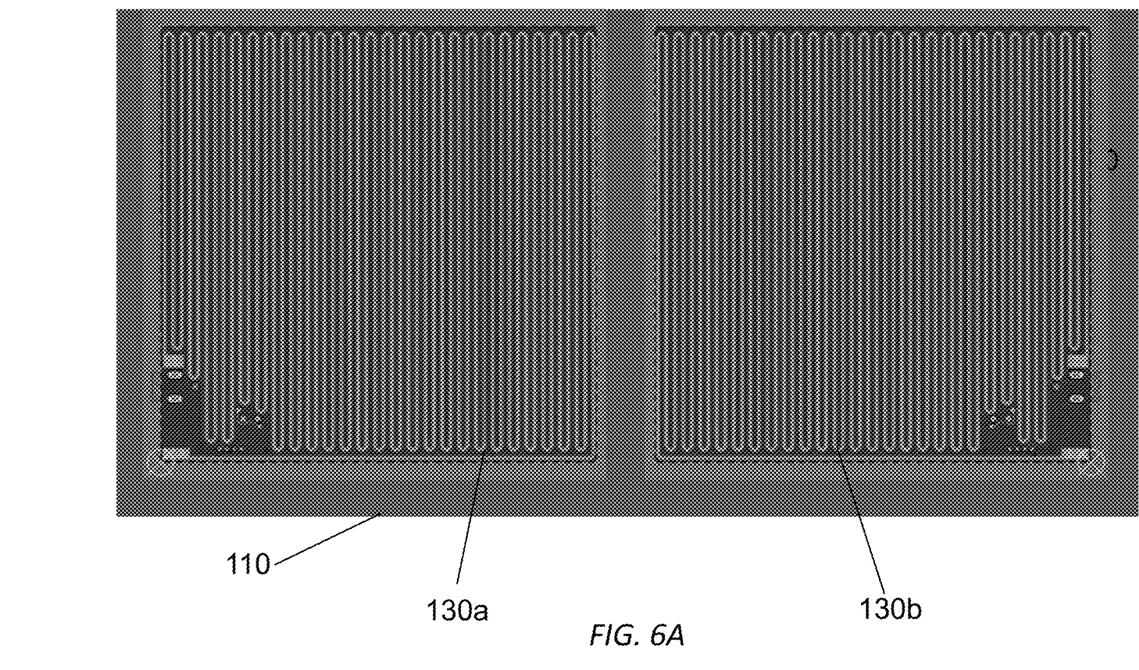
FIGS. 6A and 6B show external and internal details of an exemplary embodiment of the calibration source with two temperature sources in one unit.
Figure 6B:
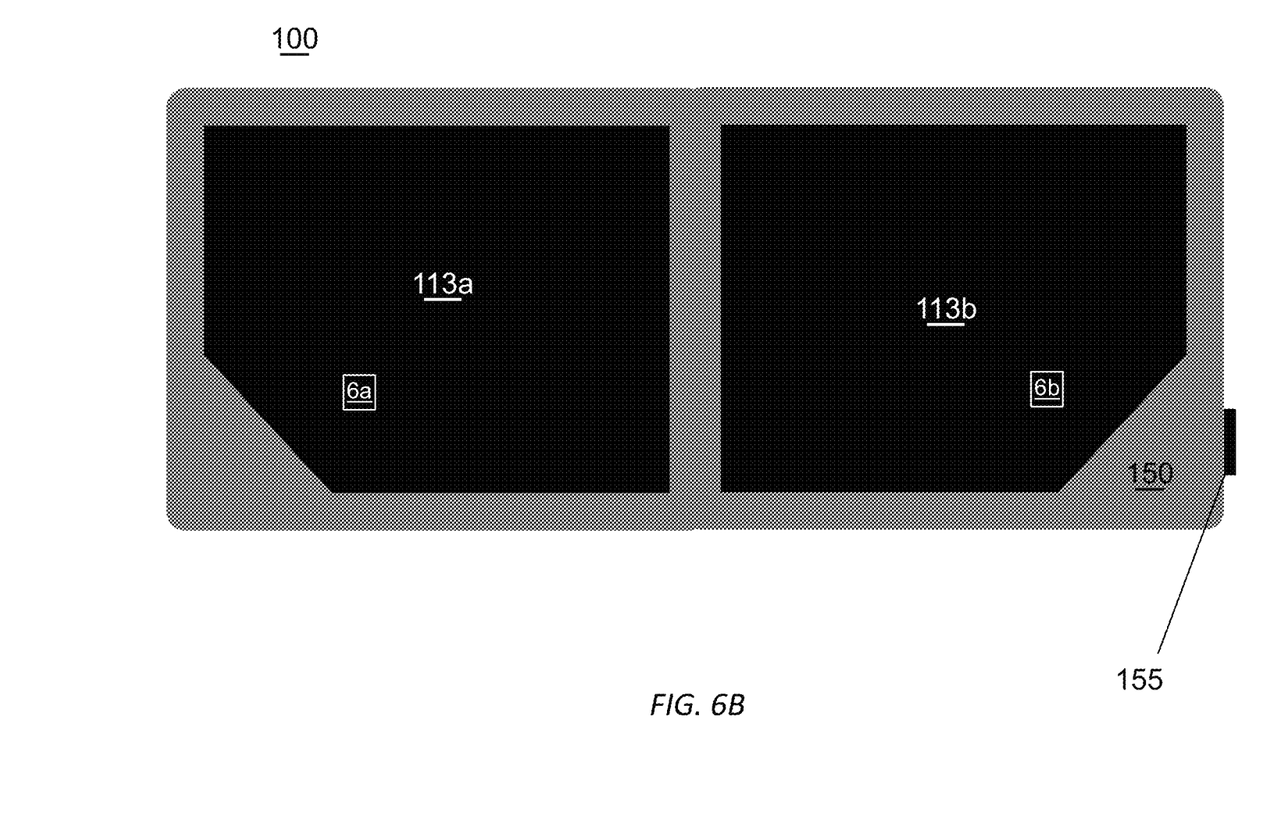

FIGS. 6A and 6B show internal and external details, respectively, of a one-PCB/two-temperature calibration source. In FIG. 6A, two separate resistive heaters 130a and 130b are disposed one layer of PCB 110. In this example embodiment, the controller and power elements are shared between the two heaters. The arrangement shown is a direct extension of the embodiments of FIG. 4 with the circuitry on the top layer, but as discussed earlier, other arrangements are possible. As shown in FIG. 6B, each heated region can include its own temperature sensor 6a, 6b. Thus, the embodiment shown in FIGS. 6A and 6B is a relatively simple extension of the single source design, where only the heater, heater driver, and temperature sensors are duplicated, while the power and control functions are shared. If the controller uses a pulse width modulation (PWM) approach to heating, it may be possible to interleave the drive signals so that the total power consumed is similar to that required for one source. For two temperatures in the example range, the PCB design will work well.

Figure 7:
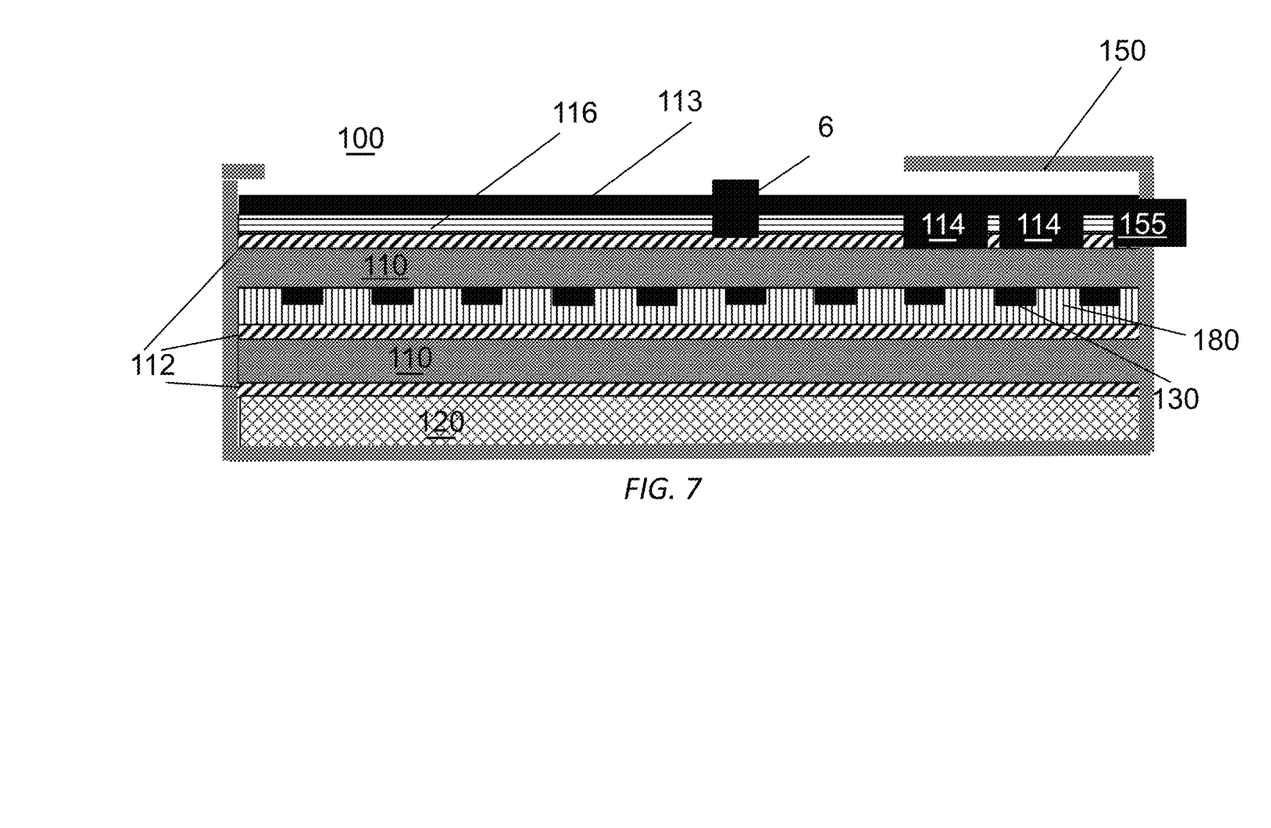
FIG. 7 shows an exemplary embodiment of a calibration source with an additional heat spreader layer.

FIG. 7 shows a further example embodiment in which an additional heat spreading layer 116 is added to the calibration source to improve temperature uniformity. The heat spreading layer 116 may comprise a piece of a metallic or other thermally conductive material (e.g., a sheet metal or the like) attached to the topmost copper layer 112. In some embodiments, the heat spreading layer 116 may be attached to the copper layer 112 with a thermally conductive adhesive. Such an additional heat spreading layer will further improve the temperature uniformity of the source surface. The coating 113, if any, can be applied to the top of layer 116 in this embodiment.

Many types of PCB technology may be suitable for this application. The common copper on fiberglass approach is clearly applicable but the PCB source could be implemented using flex PCBs, alternate substrate materials, or other types.

For the case where the power interface is USB, or a data interface is provided, and a processor is used for the control loop, it is straightforward to add data communication to the calibration source. Such communication could include reporting error conditions or allowing for user setting of blackbody temperatures for the source.

Although the primary application discussed has been a calibration source aimed at human body temperature measurement, in situ calibration for thermal imaging may be useful for many applications, and as long as the temperatures are not too extreme, the PCB-based blackbody source could be employed. Other potential applications include, but are not limited to, animal temperature detection (e.g., veterinary or livestock temperature measurement, etc.), moderate-temperature industrial processes (e.g., construction/concrete, manufacturing assembly, pharmaceutical production, in-cabin automotive, etc.) and others.

Figure 8:
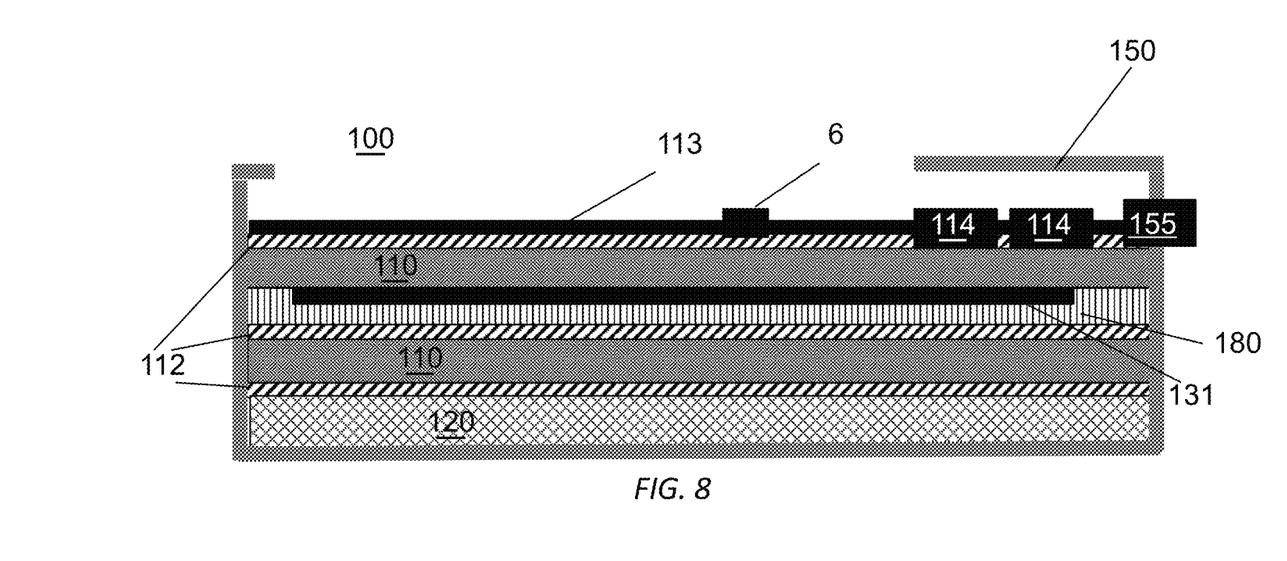
FIG. 8 shows an exemplary embodiment of a calibration source configured to operate at lower than ambient temperatures.

For some applications, it may be desired to use a calibration source at moderate temperatures cooler than an ambient temperature. For example, it may be desirable to detect fever conditions in humans in a hot-weather location where the ambient temperature is higher than human body temperature. Accordingly, as shown, in FIG. 8, a cooler 131 may be included in the calibration source 100 in some embodiments. The cooler 131 may be any suitable cooling device, such as a Peltier device. The cooler 131 may be placed on one side of a PCB instead of or in addition to a printed heater. The remaining components of the calibration device 100 may otherwise be the same or similar to those of any of the other calibration source embodiments disclosed herein, achieving a similar cost reduction for a controlled-cooler temperature calibration source 100.

Other details that may improve performance include minimizing paint thickness (e.g., the thickness of a paint or coating layer 113) to optimize apparent temperature. Also, an insulating adhesive, paint, or other coating may be placed over or applied to the pin or pins of the temperature sensor (e.g., temperature sensors 6, 6a, 6b) to prevent electrical shorts.

In some embodiments, one or more various firmware versions may be loaded into and/or stored in memory of the control circuitry during assembly as an option to better "calibrate" each blackbody source for any error when the units are tested. For example, the control circuitry may include a plurality of firmware versions corresponding to incremental temperature set point offsets (e.g., each firmware may vary by an increment of 0.05 degree C. 0.1 degree C. 0.5 degree C., etc.) to account for any offset on each individual unit.

Depending on the embodiment, certain acts, events, or functions of any of the processes described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and process steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements, and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, and Z," unless specifically stated otherwise, is otherwise understood with the context as used in general to present that an item, term, etc., may be either X. Y or Z, or any combination thereof (e.g., X, Y and/or Z). Thus, such disjunctive language is not generally intended to, and should not, imply that certain embodiments require at least one of X, at least one of Y or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or processes illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A temperature-controlled calibration source, comprising:
   a housing;
   a power supply element;
   a printed circuit board (PCB) comprising at least one copper layer, wherein a resistive heater spanning a heated region is disposed on a first side of the PCB, and wherein a heat conductive layer spanning at least a portion of the heated region is disposed on a copper layer of the PCB opposite the heater;
   a calibrated temperature sensor disposed to measure a temperature of the heat conductive layer; and
   a controller circuit configured to read the temperature sensor and to power the heater in feedback to the temperature sensor to maintain a predetermined temperature of the heat conductive layer;
   wherein the heat conductive layer functions as an even temperature blackbody calibration source for thermal camera calibration.

2. The temperature controlled calibration source of claim 1, wherein the controller circuit includes at least one of analog circuits or a programmable microcontroller.

3. The temperature controlled calibration source of claim 1, wherein the heat conductive layer is a metal layer, including at least a portion of the at least one copper layer of the PCB.

4. The temperature controlled calibration source of claim 1, wherein the controller circuit and the power supply element are disposed on the first side of the PCB, and wherein the temperature sensor is thermally connected to the heat conductive layer.

5. The temperature controlled calibration source of claim 1, wherein the heat conductive layer is at least one of painted or coated with a layer of a color having a predetermined emissivity.

6. The temperature controlled calibration source of claim 5, wherein the layer of the color is chosen to have an emissivity matching human skin, including an emissivity of one of 0.95 or 0.98+/−0.01.

7. The temperature controlled calibration source of claim 1, wherein the heat conductive layer is at least one of painted or coated with a layer of a color that provides a recognizable color for pattern recognition detection of the calibration source.

8. The temperature controlled calibration source of claim 1, wherein the resistive heater is a serpentine pattern and the heated region is a suitable shape, including one of square, circular, or rectangular.

9. The temperature controlled calibration source of claim 8, wherein the heated region is a rectangle or a square having a minimum lateral dimension greater than at least one of 2, 3, or 4 inches.

10. The temperature controlled calibration source of claim 1, wherein the power supply element includes a USB connection, a battery, an ac-dc converter, an ac-dc battery charger, a traditional ac power supply, or a solar cell power supply.

11. The temperature controlled calibration source of claim 1, further comprising a thermal insulation layer encasing at least a portion of the PCB and other components.

12. The temperature controlled calibration source of claim 1, wherein the housing includes a bezel that masks off one or more edges of the heat conductive layer, thereby masking off a part of the heat conductive layer where a temperature gradient is greatest.

13. The temperature controlled calibration source of claim 1, wherein the predetermined temperature is within a range corresponding to within at least one of 15, 10, or 5 degrees of nominal human body temperature.

14. The temperature controlled calibration source of claim 1, wherein the predetermined temperature is nominally one of 41 or 42.5 degrees C., selected to be likely the highest temperature in a scene.

15. The temperature controlled calibration source of claim 14, wherein the calibration source comprises a portion of a system including a thermal imager, the calibration source operable in conjunction with the thermal imager to calibrate the system for detection of body temperature corresponding to fever conditions.

16. The temperature controlled calibration source of claim 1, wherein the PCB comprises at least four copper layers including:
    a bottommost layer covering at least a portion of a substrate of the PCB and serving as a heat spreader;
    a second layer adjacent to the bottommost layer, the second layer covering at least a portion of the PCB substrate and serving as a heat spreader;
    a third layer adjacent to the second layer opposite the bottommost layer, the third layer having a heater etched therein; and
    a top layer adjacent to the third layer opposite the second layer, the top layer including the controller circuit, the heated region, and the temperature sensor, connected directly to the heated region.

17. The temperature controlled calibration source of claim 1 wherein the heated region includes an etched gap disposed inside at least one edge of the heated region to improve temperature uniformity across the heated region.

18. The temperature controlled calibration source of claim 17, wherein the gap is at least 1 mm wide.

19. The temperature controlled calibration source of claim 1, further comprising a heat spreading element in the form of metal sheet bonded in a thermally conductive manner to the temperature controlled surface.

20. The temperature controlled calibration source of claim 1, further comprising a data connection, wherein the controller is further configured to allow for data communication and control functions over the data connection.

* * * * *